United States Patent [19]

Sugawara et al.

[11] Patent Number: 5,048,035
[45] Date of Patent: Sep. 10, 1991

[54] SEMICONDUCTOR LIGHT EMITTING DEVICE

[75] Inventors: Hideto Sugawara, Tokyo; Masayuki Ishikawa, Nishimine; Yoshihiro Kokubun, Yokohama; Yukie Nishikawa, Narashino; Shigeya Naritsuka, Yokohama, all of Japan

[73] Assignee: Kabushiki Kaisha Toshiba, Kawasaki, Japan

[21] Appl. No.: 530,120

[22] Filed: May 29, 1990

[30] Foreign Application Priority Data

May 31, 1989 [JP] Japan ................................. 1-138869
Aug. 31, 1989 [JP] Japan ................................. 1-225641
Nov. 29, 1989 [JP] Japan ................................. 1-310247

[51] Int. Cl.$^5$ .............................................. H01S 3/19
[52] U.S. Cl. ........................................ 372/45; 357/17; 372/46
[58] Field of Search ..................... 372/45, 46; 357/16, 357/17

[56]  References Cited

U.S. PATENT DOCUMENTS

| | | | |
|---|---|---|---|
| 4,494,237 | 1/1985 | Di Forte Poisson et al. | 372/45 |
| 4,761,790 | 8/1988 | Hayakawa et al. | 372/45 |
| 4,792,958 | 12/1988 | Ohba et al. | 372/45 |
| 4,809,287 | 2/1989 | Ohba et al. | 372/45 |
| 4,835,117 | 5/1989 | Ohba et al. | 437/129 |
| 4,893,313 | 1/1990 | Hatakoshi et al. | 372/46 |
| 4,910,743 | 3/1990 | Ohba et al. | 372/45 |
| 4,922,499 | 5/1990 | Nitta et al. | 372/46 |
| 4,949,349 | 8/1990 | Ohba et al. | 372/45 |

FOREIGN PATENT DOCUMENTS 0280694 12/1986 Japan .
0057271 3/1987 Japan .

OTHER PUBLICATIONS

Appl. Phys. Lett. 47(10); Nov. 15, 1985; Masao Ikeda et al., "Room-Temperature Continuous-Wave Operation of an AlGaInP Double Heterostructure Laser Grown by Atmospheric Pressure Metalorganic Chemical Vapor Deposition", pp. 1027-1028.

Primary Examiner—Georgia Epps
Attorney, Agent, or Firm—Oblon, Spivak, McClelland, Maier & Neustadt

[57]  ABSTRACT

A semiconductor light emitting device, especially, a light emitting diode includes a compound semiconductor substrate of a first conductivity type, an InGaAlP layer formed on the substrate and having a light emitting region, a GaAlAs layer of a second conductivity type formed on the InGaAlP layer and having a larger band gap than that of the InGaAlP layer, and an electrode formed on a part of the GaAlAs layer. The light emitting diode emits light from a surface at the electrode side except for the electrode. A current from the electrode is widely spread by the GaAlAs layer to widely spread a light emitting region.

14 Claims, 5 Drawing Sheets

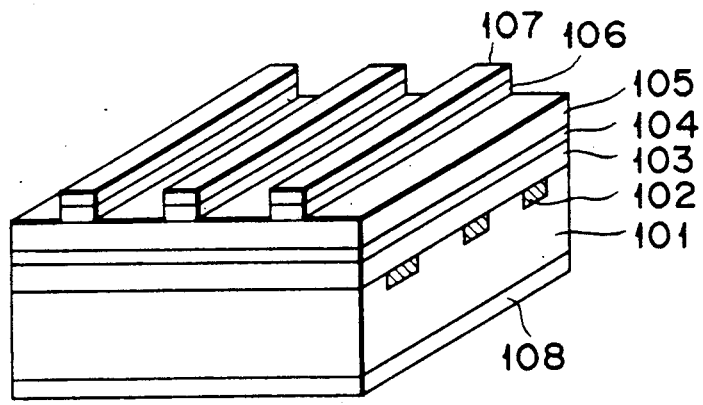
F I G. 10
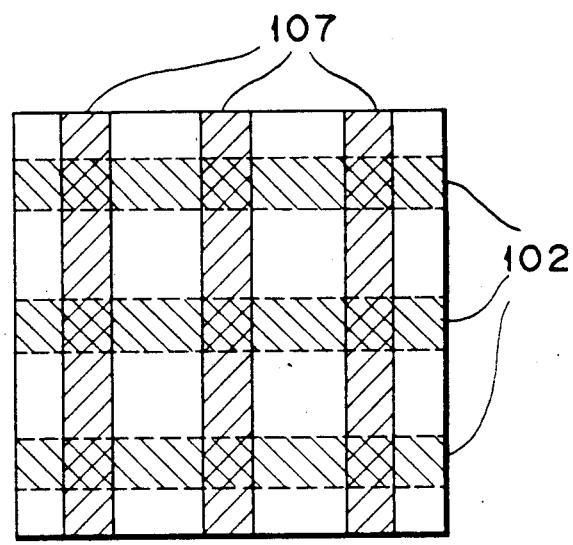
F I G. 11

SEMICONDUCTOR LIGHT EMITTING DEVICE

BACKGROUND OF THE INVENTION

1. Field of the Invention

The present invention relates to a semiconductor light emitting device and, more particularly, to a semiconductor light emitting device using an InGaAlP system semiconductor material.

2. Description of the Related Art

Of Group III-V compound semiconductors which are lattice-matched with GaAs, an $In_{1-y}(Ga_{1-x}Al_x)_yP$ mixed crystal ($0 \leq x \times \leq 1$ and $0 \leq y \leq 1$) has a largest direct transition band gap and therefore has been receiving a lot of attention as a light emitting device material for a visible light region. Recently, an InGaAlP crystal layer can be formed on a GaAs substrate by a chemical vapor deposition method using an organometalic compound (to be abbreviated as an MOCVD method hereinafter), and a visible light semiconductor laser using this technique is reported.

In a light emitting diode for a visible light region, a GaAlAs system material is used in a red region to realize a device having a high luminance. Since, however, an indirect transition material such as GaP or GaAsP is used in a region having a shorter wavelength than that of the red region, no device having a high luminance equal to that of the device for the red region has been realized.

Since an InGaAlP system material has a direct transition band structure up to a green region as described above, a light-emitting diode having a high luminance throughout a wide visible light region can be realized by using this material. In order to realize such a device, however, InGaAlP having a low resistivity must be grown to decrease a system resistance of the device, but it is difficult to obtain low resistivity InGaAlP especially in a p-type layer. In order to decrease the resistivity of a p-type layer, a high-concentration p-type impurity must be doped. In the InGaAlP system material, however, if a p-type impurity is doped at a high concentration, only a part of the doped impurity can be electrically activated, i.e., activity is reduced to cause carrier concentration saturation. In addition, if an Al content is increased, a ratio of the doped impurity to be contained is reduced to limit the concentration of the doped impurity. Furthermore, mobility of carriers in InGaAlP is comparatively small. In particular, mobility of holes is as very small as 10 to 20 $cm^2/V.s$. Therefore, the resistivity cannot be reduced very much upon doping at a concentration of about $10^{18}$ $cm^{-3}$. For this reason, in an LED structure in which a first clad layer consisting of n-type InGaAlP, an active layer consisting of InGaAlP, and a second clad layer consisting of p-type InGaAlP are stacked in the order named on a substrate consisting of n-type GaAs holes injected from an electrode are not easily spread in the lateral direction, and most of light emission recombination in the active layer takes place below an electrode at a p-type layer side. Therefore, light emission occurs in only a peripheral portion of the p-type layer side electrode, resulting in a very low emission light extraction efficiency. Since an n-type dopant can be comparatively easily doped at a high concentration, an LED structure may be formed by stacking first clad layer consisting of p-type InGaAlP, an active layer consisting of InGaAlP, and a second clad layer consisting of InGaAlP in the order named on a substrate consisting of p-type GaAs. Mobility of electrons in In-GaAlP is not so high, i.e., about 100 $cm^2/V.s$ within a composition range having large Al content to be used in a clad layer. In order to spread an injection current in the lateral direction, therefore, the thickness of the n-type second clad layer must be increased to be several tens $\mu m$ or more. It is not theoretically impossible to grow a thick film having the above thickness by the MOCVD method suitable as a crystal growth method for the InGaAlP material. This technique, however, is not practical since it requires, e.g., a very long growth time or a very large amount of a Group V source gas.

SUMMARY OF THE INVENTION

It is an object of the present invention to provide a semiconductor light emitting device having a high light extraction efficiency and a high luminance.

According to the present invention, there is provided a semiconductor light emitting device comprising a compound semiconductor substrate of a first conductivity type, an InGaAlP layer formed on the substrate and having a light emitting region, a GaAlAs layer formed on the InGaAlP layer and having a larger band gap than that of the InGaAlP layer, and an electrode formed on a part of the GaAlAs layer, wherein light is emitted from a surface at the electrode side except for the electrode.

In addition, according to the present invention, there is provided a semiconductor light emitting device comprising:

a compound semiconductor substrate of a first conductivity type;

a lower clad layer formed on the substrate and consisting essentially of InGaAlP of a first conductivity type;

an active layer formed on the lower clad layer and consisting essentially of InGaAlP;

an upper clad layer formed on the active layer and consisting essentially of InGaAlP of a second conductivity type; and a current blocking region of the first conductivity type formed on the upper clad layer and having a larger band gap than that of the InGaAlP layer constituting the active layer.

Furthermore, according to the present invention, there is provided a semiconductor light emitting device comprising:

a compound semiconductor substrate of a first conductivity type;

a lower clad layer formed on the substrate and consisting essentially of InGaAlP of the first conductivity type;

an active layer formed on the lower clad layer and consisting essentially of InGaAlP., and an upper clad layer formed on the active layer and consisting essentially of InGaAlP of a second conductivity type, wherein an intermediate band gap region having a band gap larger than that of the substrate and smaller than that of the lower clad layer is selectively formed between the substrate and the lower clad layer.

Additional objects and advantages of the invention will be set forth in the description which follows, and in part will be obvious from the description, or may be learned by practice of the invention. The objects and advantages of the invention may be realized and obtained by means of the instrumentalities and combination particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 10 and 11 are perspective and plan views, respectively, showing a relationship between an intermediate band gap region and an electrode at an n-type side in a modification of the LED shown in FIG. 8.

DETAILED DESCRIPTION OF THE PREFERRED EMBODIMENTS

Various types of embodiments of the present invention will be described below with reference to the accompanying drawings.

Figure 1:
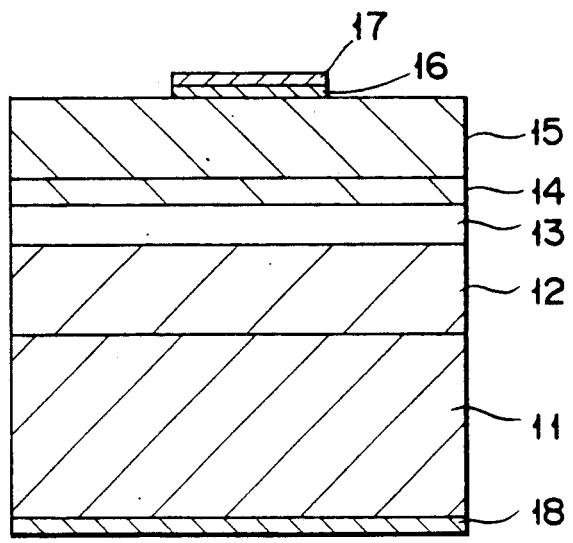
FIG. 1 is a sectional view showing an LED (light-emitting diode) according to one embodiment of the present invention.

FIG. 1 is a schematic sectional view showing a structure of a semiconductor light emitting device according to one embodiment of the present invention. As shown in FIG. 1, a lower clad layer 12 consisting of n-$In_{0.5}(Ga_{1-x}Al_x)_{0.5}P$, an active layer 13 consisting of $In_{0.5}(Ga_{1-y}Al_y)_{0.5}P$, an upper clad layer 14 consisting of p-$In_{0.5}(Ga_{1-z}Al_z)_{0.5}P$, a p-$Ga_{1-p}Al_pAs$ layer 15, and a contact layer 16 consisting of p-GaAs are sequentially stacked on one major surface of a substrate 11 consisting of n-GaAs. A p-type side first electrode 17 consisting of Au-Zn is formed on the contact layer 16, and an n-type side second electrode 18 consisting of Au-Ge is formed on the other major surface of the substrate 11. The thickness of the p-GaAlAs layer 15 is much larger than that of the upper clad layer 14.

Figure 2:
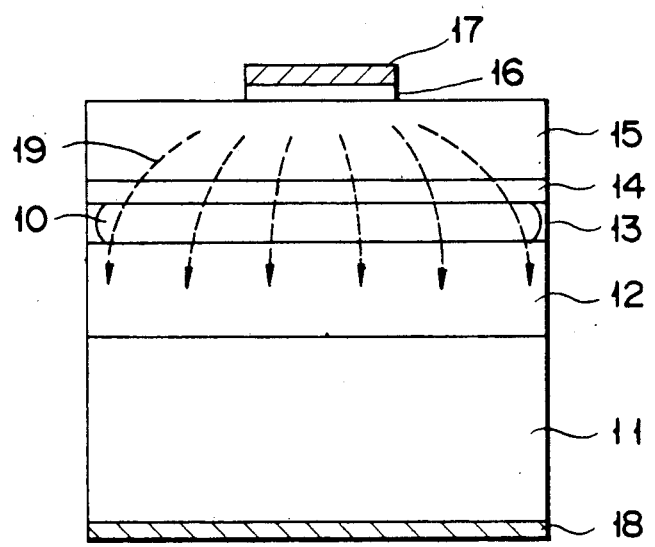
FIG. 2 is a sectional view showing a current distribution and a light emitting region of the LED shown in FIG. 1.

FIG. 2 shows a current distribution and a light emitting portion inside the device shown in FIG. 1. Referring to FIG. 2, broken-line arrows 19 indicate a current distribution in the device, and reference numeral 10 denotes a light emitting portion. In order to obtain a high light-emission efficiency, Al contents x, y, and z in each InGaAlP layer satisfy $y \leq x$ and $y \leq z$. That is, a double heterojunction is formed such that an energy gap of the active layer 13 serving as a light emitting layer is smaller than those of the two p- and n-type clad layers 12 and 14. Each of x, y, and z satisfies a corresponding one of the following inequalities:

$0 \leq x \leq 1$, preferably, $0.5 \leq x \leq 1$ $0 \leq y \leq 1$, preferably, $0 \leq y < 0.6$ $023 z \leq 1$, preferably, $0.5 \leq z \leq 1$ A band gap larger than that of the active layer 13 is selected for the p-GaAlAs layer 15 so that the layer 15 becomes transparent with respect to the wavelength of light emitted from the active layer 13. For example, p in $Ga_{1-p}Al_pAs$ preferably satisfies $0.45 \leq p \leq 1$.

Although an LED having the above double heterojunction structure will be described below, a layer structure of an active layer portion is not essential in terms of a light extraction efficiency. Therefore, a singe heterojunction structure or a homojunction structure can be considered to be equivalent to the above double heterojunction structure.

In the structure shown in FIGS. 1 and 2, the thickness and carrier concentration of each layer are set as shown in the following parentheses: the substrate 11 (80 μm, $3 \times 10^{18}$ cm$^{-3}$), the lower clad layer 12 (1 μm, $5 \times 10^{17}$ cm$^{-3}$), *the active layer* 13 (0.5 μm, undoped), the upper clad layer 14 (0.2 μm, $4 \times 10^{17}$ cm$^{-3}$), the p-GaAlAs layer 15 (3 μm, $3 \times 10^{18}$ cm$^{-3}$), and the contact layer 16 (0.1 μm, $3 \times 10^{18}$ cm$^{-3}$). Note that the thickness of the p-GaAlAs layer 15 is preferably 1 μm to 20 μm.

One feature of the above structure is that the p-GaAlAs layer 15 having a much larger thickness than that of the lower clad layer 12 consisting of p-InGaAlP is formed on the layer 12. Superiority of this structure will be described below.

If the p-GaAlAs layer 15 is not present in the structure shown in FIG. 1, spread of a current in the upper clad layer consisting of p-InGaAlP is small because its resistivity is high. The current spread may be widened by increasing the thickness of the layer. Since, however, thermal conductivity is low in an InGaAlP system material, a large film thickness is not preferred because crystal quality is degraded and the overlying layer is adversely affected. In addition, in an InGaAlP system semiconductor material, since a growth speed is limited in consideration of the crystal quality, a growth time must be prolonged in order to grow a thick film. If an impurity having high diffusibility is used in the clad layer, therefore, impurity diffusion to the active layer occurs to degrade the device characteristics. For this reason, it is difficult to grow a thick InGaAlP layer. By forming the p-GaAlAs layer 15 which can be lattice matched with GaAs to realize a low resistivity and a high growth speed on the upper clad layer 14 consisting of p-InGaAlP, a current injected from the electrode can be spread in the p-GaAlAs layer 15, thereby enabling light emission in a wide region except for a portion immediately below the electrode. The resistivities of the upper clad layer 14 consisting of p-$In_{0.5}(Ga_{0.3}Al_{0.7})_{0.5}P$ and the p-$(Ga_{0.2}Al_{0.8})As$ layer 15 used in this embodiment at the carrier concentration described above are 1 Ωcm and 0.05 Ωcm, respectively. Since, therefore, a resistivity difference is large, a current injected from the electrode is widely spread in the p-GaAlAs layer 15 before reaching the p-type clad layer 14.

In the above stacking structure, a device was constituted by using 0.3 as the Al content y in the $In_{0.5}(Ga_{1-y}Al_y)_{0.5}P$ active layer, and a voltage was applied in the forward direction to flow a current. As a result, the current distribution shown in FIG. 2 was obtained, and light emission having a peak wavelength at 610 mm was obtained throughout a wide surface region of the device except for the p-type side electrode (Au-Zn) 17.

The present invention is not limited to the above embodiment. For example, although $In_{0.5}(Ga_0..$ $_7Al_{0.3})_{0.5}P$ is used as the composition of the active layer in the above embodiment, light emission of a visible light region from red to green regions can be obtained by changing the Al content. In addition, $In_{0.5}(Ga_{0.3}Al_{0.7})_{0.5}P$ is used as the composition of the clad layer in the above embodiment. The composition, however, is not limited to that of the above embodiment but may be any composition provided that a satisfactory band gap difference for entrapping carriers is obtained with respect to the active layer. Although the upper clad layer 14 consisting of p-InGaAlP is formed between the InGaAlP active layer 13 and the p-GaAlAs layer 15 in the above embodiment, the same effect can be obtained by a structure in which the p-GaAlAs layer 15 is formed directly on the active layer 13 consisting of InGaAlP. In this structure, however, a band gap difference with respect to the active layer 13 is smaller than that in the structure in which the upper clad layer 14 consisting of p-InGaAlP is formed. Therefore, overflow of carriers occurs more easily than in the structure of the above embodiment to slightly degrade the device characteristics. Since, however, a light extraction efficiency much higher than that obtained by a conventional structure can be obtained by current spread in the p-GaAlAs layer, the use of this structure is highly advantageous. In addition to the structures described above, the same effect can be obtained by a structure in which a GaAlAs layer is formed on a light emitting portion formed of InGaAlP having a different Al content or a structure in which a light emitting portion is constituted by an InGaAlP layer and a GaAlAs layer.

Although 0.8 is used as the Al content of the $Ga_{1-p}Al_pAs$ layer of the above embodiment, the composition is not limited to that of the above embodiment but may be any composition provided that a satisfactory band gap for obtaining transparency with respect to the wavelength of light emitted from the light emitting portion is obtained.

As described above, according to the LED shown in FIG. 1, the p-GaAlAs layer having a much larger film thickness and a lower resistivity than those of the p-InGaAlP clad layer is formed on the clad layer. Therefore, a current injected from the electrode portion is spread in the p-GaAlAs layer throughout a wide region except for a portion immediately below the electrode before reaching the p-InGaAlP clad layer. As a result, since a light emitting region can be spread throughout a wide region except for the portion immediately below the electrode, a light extraction efficiency is increased to realize high-luminance light-emission.

Figure 3:
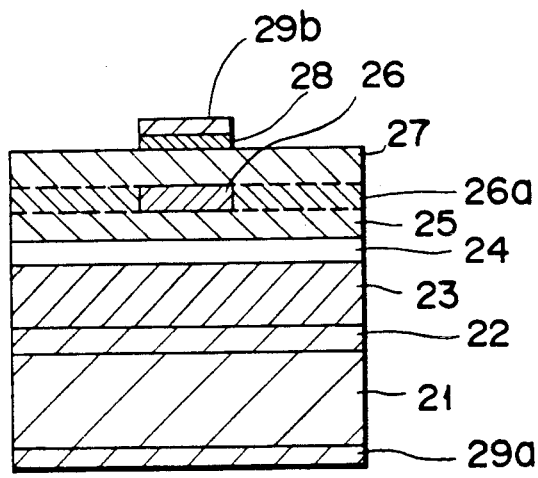
FIG. 3 is a sectional view showing an LED having a current blocking layer according to another embodiment of the present invention.

FIG. 3 is a sectional view showing a structure of an LED according to another embodiment of the present invention. As shown in FIG. 3, this LED has a double heterojunction structure formed by sequentially stacking a buffer layer 22 formed by Si doping to have an n-type impurity concentration of $2 \times 10^{18}$ cm$^{-3}$ and a thickness of 0.5 μm and consisting of n-GaAs, a lower clad layer 23 formed by Si doping to have an n-type impurity concentration of $2 \times 10^{18}$ cm$^{-3}$ and a thickness of 2 μm and consisting of n-$In_{0.5}(Ga_{0.3}Al_{0.7})_{0.5}P$, an undoped active layer 24 having a thickness of 0.5 μm and consisting of $In_{0.5}(Ga_{0.55}Al_{0.45})_{0.5}P$, a first upper clad layer 25 formed by Zn doping to have a p-type impurity concentration of $4 \times 10^{17}$ cm$^{-3}$ and a thickness of 1 μm and consisting of p-$In_{0.5}(Ga_{0.3}Al_{0.7})_{0.5}P$, a current blocking layer 26 formed by Si doping to have an n-type impurity concentration of $2 \times$ cm$^{-3}$ and a thickness of 0.5 μm and consisting of n-$In_{0.5}(Ga_{0.3}Al_{0.7})_{0.5}P$, a second upper clad layer 27 formed by Zn doping to have a p-type impurity concentration of $7 \times 10^{17}$ cm$^{-3}$ and a thickness of 1 μm and consisting of p-$In_{0.5}(Ga_{0.3}Al_{0.7})_{0.5}P$, and a contact layer 28 formed by Zn doping to have a p-type impurity concentration of $1 \times 10^{18}$ cm$^{-3}$ and a thickness of 0.05 μm and consisting of p-$In_{0.5}Ga_{0.5}P$ on a substrate 21 formed by Si doping to have an n-type impurity concentration of $3 \times 10^{18}$ cm$^{-3}$ and consisting of n-GaAs. An n-type side electrode, i.e., a first electrode 29a consisting of Au-Ge is formed on the lower surface of the substrate 21, and a p-type side electrode, i.e., a second electrode 29b consisting of Au-Zn is formed on the contact layer 28.

A method of manufacturing the LED shown in FIG. 3 will be described below with reference to FIGS. 4A to 4D.

Figures 4A, 4B:
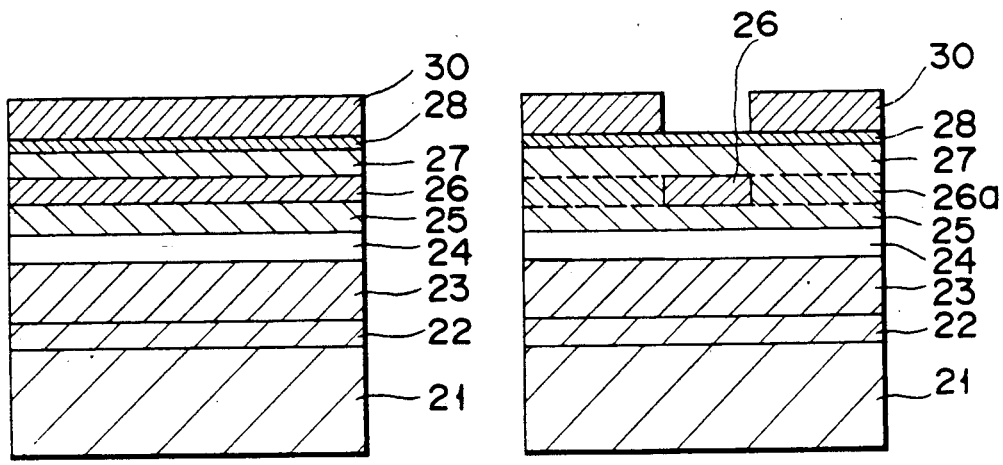
FIGS. 4A to 4D are sectional views for explaining manufacturing steps of the LED shown in FIG. 3.

Firstly, the substrate 21 formed by Si doping to have an n-type impurity concentration of $3 \times 10^{18}$ cm$^{-3}$ and consisting of n-GaAs is prepared, and Si is doped in its upper surface by a reduced-pressure organometallic chemical vapor deposition method (to be abbreviated to a reduced pressure MOCVD method hereinafter), thereby forming the buffer layer 22 consisting of n-GaAs and having an n-type impurity concentration of $3 \times 10^{18}$ cm$^{-3}$ and a thickness of 0.5 μm. Thereafter, Si is similarly doped to form the lower clad layer 23 consisting of n-$In_{0.5}(Ga_{0.3}Al_{0.7})_{0.5}P$ and having an n-type impurity concentration of $3 \times 10^{18}$ cm$^{-3}$ and a thickness of and the active layer 24 consisting of $In_{0.5}(Ga_{0.55}Al_{0.45})_{0.5}P$ and having a thickness of 0.5 μm is formed without doping. Zn is doped to form the first upper clad layer 25 consisting of p-$In_{0.5}(Ga_{0.3}Al_{0.7})_{0.5}P$ and having a p-type impurity concentration of $4 \times 10^{17}$ cm$^{-3}$, and a thickness of 1 μm, and Si is doped to form the current blocking layer 26 consisting of n-$In_{0.5}(Ga_{0.3}Al_{0.7})_{0.5}P$ and having an n-type impurity concentration of $2 \times 10^{17}$ cm$^{-3}$ and a thickness of 0.5 μm. Subsequently, Zn is doped to form the second upper clad layer 27 consisting of p-$In_{0.5}(Ga_{0.3}Al_{0.7})_{0.5}P$ and having a p-type impurity concentration of $7 \times 10^{17}$ cm$^{-3}$ and a thickness of 1 μm, and Zn is doped to form the contact layer 28 consisting of p-$In_{0.5}Ga_{0.5}P$ and having a p-type impurity concentration of $1 \times 10^{18}$ cm$^{-3}$ and a thickness of 0.05 μm. These layers are thus sequentially grown to form a double heterojunction structure. Subsequently, Si is doped to grow a cap layer 30 consisting of n-GaAs and having an n-type impurity concentration of $8 \times 10^{18}$ cm$^{-3}$ and a thickness of 0.5 μm (FIG. 4A). The above reduced-pressure MOCVD method was performed at a substrate temperature of 730° C., a pressure in a reaction tube of 25 Torr, and a growth rate of 3 μm/h.

After a portion of the cap layer 30 consisting of n-GaAs to which a p-type side electrode is to be connected is removed by etching as shown in FIG. 4B, annealing is performed at 650° C. for 30 minutes. In this case, annealing is performed in a $PH_3$ atmosphere in order to prevent evaporation of P from an exposed surface of the contact layer 18 consisting of p-$In_{0.5}Ga_{0.5}P$. By this annealing, the conductivity type of a portion 26a of the current blocking layer 26 consisting of n-$In_{0.5}(Ga_{0.3}Al_{0.7})_{0.5}P$ corresponding to a lower portion of the cap layer 30 consisting of n-GaAs is changed to p type.

Figures 4C, 4D:
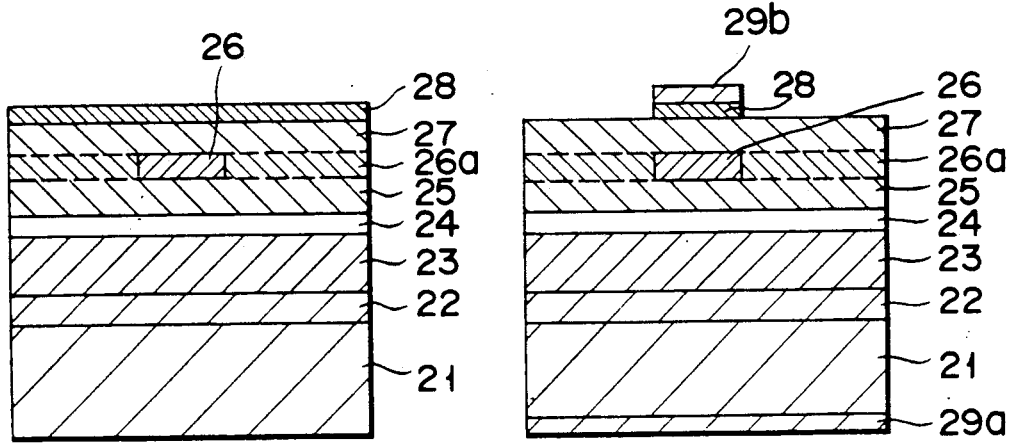

Subsequently, after the n-GaAs cap layer 30 is removed by etching as shown in FIG. 4C, an Au-Ge electrode 29a is formed on the entire lower surface of the substrate 21 consisting of n-GaAs, the Au-Zn electrode 29b is formed on the contact layer 28 consisting of p-In$_{0.5}$Ga$_{0.5}$P, and a portion of the cap layer 30 consisting of p-In$_{0.5}$Ga$_{0.5}$P except for a portion corresponding to the Au-Zn electrode 29b is removed by etching, as shown in FIG. 4D.

When a voltage was applied in a forward direction to flow a current through a 0.3-mm×0.3-mm square device having the above stacking structure, green light emission having a peak wavelength at 550 mm was observed from a peripheral portion except for the Au-Zn electrode portion. This device was molded by an epoxy resin, and a luminance of the molded device was measured. As a result, a green light emitting diode having a high luminance of more than 500 mcd was obtained. This result is remarkable as compared with a light emission luminance obtained by conventional GaP not exceeding 200 mcd.

A modification of the LED shown in FIG. 3 will be described below with reference to FIG. 5.

Figure 5:
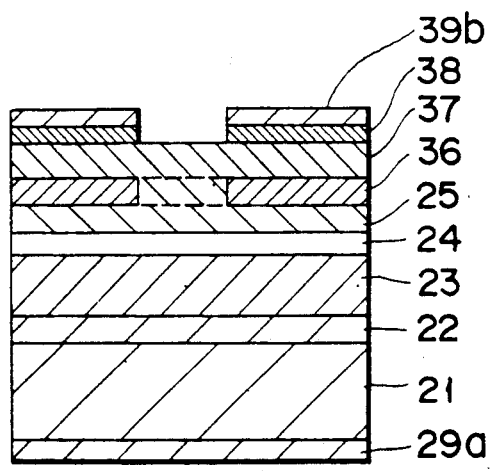
FIG. 5 is a sectional view showing a modification of the LED shown in FIG. 3.

Since an LED shown in FIG. 5 is the same as that shown in FIG. 3 except for the shapes of a current blocking layer, a contact layer, and an Au-Zn electrode, the other portions are represented by the same reference numerals as in the FIG. 3 and a detailed description thereof will be omitted.

As shown in FIG. 5, each of a current blocking layer 36, and a contact layer 38 and an Au-Zn electrode 39b both of which oppose the layer 36 is formed on a peripheral portion.

This structure can be manufactured by the same manufacturing method as shown in FIGS. 4A to 4D by forming a cap layer 30 consisting of n-GaAs shown in FIG. 4C on a central portion.

According to the light emitting diode having the above structure, a current density in a light emitting region can be easily increased to be higher than that of the light emitting diode of the embodiment shown in FIG. 3, thereby realizing a light emitting diode having a higher luminance.

In the embodiment shown in FIGS. 3 to 5, In$_{0.5}$(Ga$_{0.3}$Al$_{0.7}$)$_{0.5}$P is used as the composition of the current blocking layer. The composition of the current blocking layer, however, is not limited to that of the above embodiment but may be any composition provided that a satisfactory band gap for obtaining transparency with respect to the wavelength of light emitted from the active layer is obtained. Although In$_{0.5}$(Ga$_{0.55}$Al$_{0.45}$)$_{0.5}$P is used as the composition of the active layer in the above embodiment, light emission of a visible light region from red to green regions can be obtained by changing the Al content. In the above embodiment, In$_{0.5}$(Ga$_{0.3}$Al$_{0.7}$)$_{0.5}$P is used as the composition of the clad layer. The composition of the clad layer, however, is not limited to that of the above embodiment but may be any composition provided that a satisfactory band gap difference for entrapping carriers is obtained with respect to the active layer. Although n-type GaAs is used as the cap layer in the above embodiment, the same effect can be obtained by using n-type GaAlAs or n-type InGaAlP. In addition, although Zn is used as an impurity to be doped in the p-type clad layer in the above embodiment, the same effect can be obtained by using another p-type impurity such as Mg.

A principle of the embodiment shown in FIGS. 3 to 5 described above will be described in detail below. A conventional light emitting diode consisting of In$_{1-y}$(Ga$_{1-x}$Al$_x$)$_y$P ($0 \leq x \leq 1$ and $0 \leq y \leq 1$) has a problem in that light emission is limited to a peripheral portion of a surface electrode. The present inventors, however, have made extensive studies and found that the above conventional problem can be solved by forming an n type current blocking portion in a p-type clad layer and the current blocking portion can be formed by selective diffusion of a p-type impurity contained in the p-type clad layer. That is, in this structure, a current flow in the p-type clad layer is bent toward a peripheral portion by a p-n junction potential barrier formed because the current blocking portion has n conductivity type. As a result, light emission occurs in a region corresponding to a portion outside a p-side electrode to improve an emission light extraction efficiency. In addition, it is found that diffusion of the p-type impurity contained in the p-type clad layer depends on the structure of a cap layer formed on the p-type clad layer. That is, a p-type InGaAlP layer containing Zn as an impurity was formed on an n-type InGaAlP layer, and a cap layer consisting of n-type GaAs was formed thereon. Thereafter, a part of the cap layer was removed by etching to form a portion at which the surface of the p-type InGaAlP layer was exposed and a portion at which its surface was covered with the cap layer, and annealing was performed. As a result, while Zn was diffused in the n-type InGaAlP layer below the portion on which the cap layer was left to convert the conductivity type of the layer to p type, no Zn was diffused in the n-type InGaAlP layer located below the portion from which the cap layer was removed and the conductivity type of the layer was still n type. Diffusion of Zn occurs more easily when the concentration of Zn contained in the p-type InGaAlP layer is higher and the Al content of the n-type InGaAlP layer is larger. Therefore, by increasing the Al content of the n-type InGaAlP layer inserted in the p-type clad layer to be larger than that of an active layer consisting of InGaAlP and setting the concentration of Zn in the p-type clad layer to be a proper value, an n-type InGaAlP layer having a shape corresponding to that of the n-type GaAs cap layer formed on the surface of the p type clad layer can be buried in the p-type clad layer. The effect can be similarly obtained by using n-type GaAlAs or n-type InGaAlP in place of n-type GaAs as the cap layer.

As described above, according to the embodiment shown in FIGS. 3 to 5, in the light emitting diode using the In$_{1-y}$(Ga$_{1-x}$Al$_x$)$_y$P system material ($0 \leq x \leq 1$ and $0 \leq y \leq 1$), the current blocking portion for spreading a current in the p-type clad layer is formed and buried. Therefore, since emitted light can be extracted by current spread without being interrupted by an electrode, a high-luminance visible light emitting diode can be realized.

In addition, the present invention is very practical since the current blocking portion can be advantageously formed and buried by performing crystal growth only once.

Still another embodiment of the present invention will be described below with reference to FIGS. 6 and 7.

Figure 6:
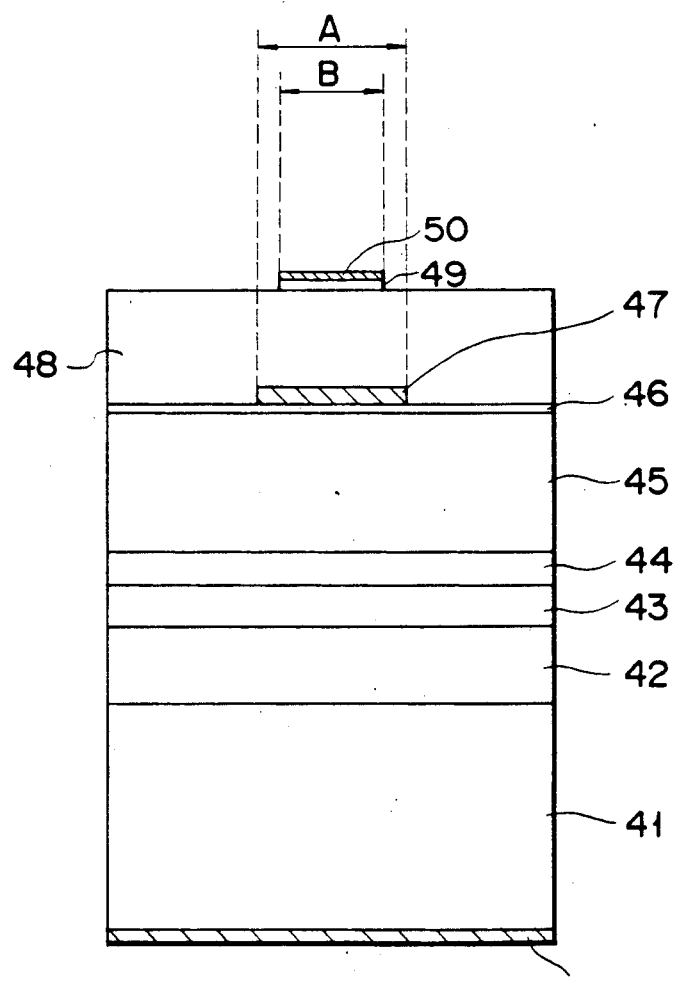
FIGS. 6 and 7 are sectional views showing an LED having a current blocking layer according to still another embodiment of the present invention.
Figure 7:
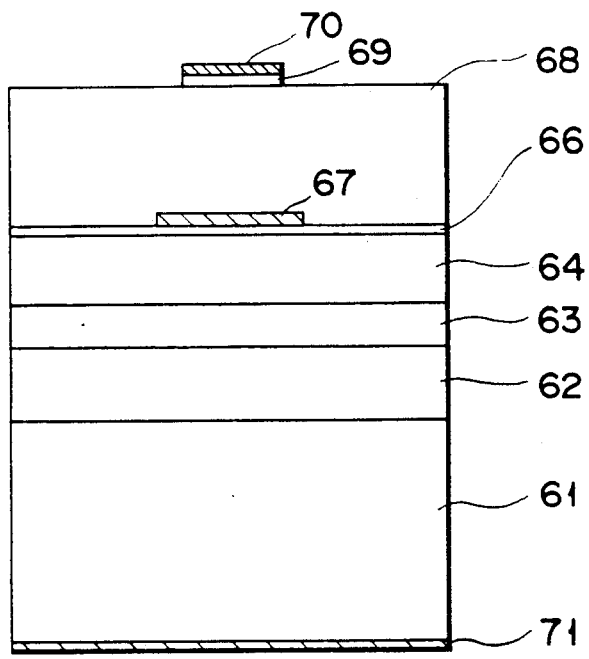

In FIG. 6, reference numerals 41 to 45 correspond to reference numerals 11 to 15 in FIG. 1. A cap layer 46 consisting of p-InGaP and a current blocking layer 47 consisting of n-In$_{0.5}$(Ga$_{1-z}$Al$_z$)$_{0.5}$P are sequentially formed by a single crystal growth on a p-Ga$_{1-p}$Al$_p$As layer 45, and selective etching is performed by using hot phosphoric acid to form the current blocking layer 47 consisting of n-InGaAlP. Thereafter, a p-Ga$_{1-p}$Al$_p$As layer 48 and a contact layer 49 consisting of p-GaAs are sequentially stacked by the second crystal growth, a p-type side electrode 50 consisting of Au-Zn is formed on the contact layer 49, and an n-type side electrode 51 consisting of Au-Ge is formed on the other major surface of an n-GaAs substrate 41.

The p-type side electrode 50 is formed immediately above the current blocking layer by a lift-off method using a resist or the like or etching. A portion of the contact layer 49 consisting of p-GaAs except for a portion corresponding the electrode 50 is removed by an ammonia hydrogen peroxide system selective etchant.

If an Al composition y of the active layer 43 consisting of $In_{0.5}(Ga_{1-y}Al_{1-y})_{0.5}P$ is increased, the p-InGaP cap layer 46 serves as an absorption layer with respect to light emission of the active layer. In general, however, crystal growth cannot be performed well on a GaAlAs layer because its GaAlAs surface as a growth major surface is easily oxidized to form an oxide film, and a material having selectivity with respect to an etchant must be used in order to form the current blocking layer 47 consisting of n-InGaAlP. In this embodiment, therefore, the p-InGaP layer 46 is formed. The layer 46 need only have a thickness which can satisfy the above conditions. As the thickness is decreased, the above mentioned absorbing effect with respect to light emission of the active layer is weakened. In this embodiment, the thickness of the layer 46 is 500 Å. The thicknesses and carrier concentrations of the layers 41 to 45 are the same as those of the layers 11 to 15 in FIG. 1, respectively. The thicknesses and carrier concentrations of the other layers are shown in the following parentheses: the current blocking layer consisting of n-$In_{0.5}(Ga_{1-z}Al_z)_{0.5}P$ (0.15 μm, $2 \times 10^{18}$ cm$^{-3}$), p-$Ga_{1-p}Al_pAs$ layer 48 (5 μm, $2 \times 10^{18}$ cm$^{-3}$), and the contact layer 49 consisting of p-GaAs (0.1 μm, $3 \times 10^{18}$ cm$^{-3}$).

The above structure differs from conventional structures and the embodiment shown in FIG. 1 in that the p-GaAlAs layer 45 having a much larger thickness than that of an upper clad layer 44 consisting of p-InGaAlP is formed on the layer 44, the p-InGaP thin film and the current blocking layer 47 consisting of n-InGaAlP located immediately below the p-type side electrode are formed on the p-GaAlAs layer 45, and the p-GaAlAs layer 48 is formed on the upper surface of the layer 47 by the second crystal growth. Superiority of this structure will be described below.

As has been described above in the embodiment shown in FIG. 1, in conventional structures, current spread in the upper clad layer consisting of p-InGaAlP is small because the resistivity of the layer is high. Since, therefore, light emission mainly occurs immediately below a current, no highly efficient LED can be obtained. In the embodiment shown in FIG. 1, however, the p-GaAlAs layer having a low resistivity is used to spread a current and therefore a light emitting region, thereby realizing a highly efficient LED. In the embodiment shown in FIG. 6, the current blocking layer 47 is formed on the p-GaAlAs layer 4 to further spread the current and the light emitting region. That is, a current injected from the electrode 50 flows into a region of the p-GaAlAs layer 48 having no current blocking layer therebelow. The current injected into the p-GaAlAs layer 45 by the effect of the embodiment shown in FIG. 1 is spread more widely to enable light emission in a wide range except for a portion immediately below the current. At this time, by setting the outer surface of the p-type side electrode to coincide with or be included in the outer surface of the current blocking layer, an influence of the electrode covering the light emitting region can be reduced. Actually, in the above stacking structure, the p-type side electrode having a diameter A of 200 μm and the current blocking layer having a diameter B of 240 μm were concentrically formed, the device was constituted by using 0.3 as the Al content y of the $In_{0.5}(Ga_{1-y}Al_y)_{0.5}P$ active layer, and a voltage was applied in a forward direction to flow a current. As a result, light emission exceeding a luminous intensity of 1 cd and having a peak wavelength at 585 nm was obtained from a wide area of the device surface except for the p-type side electrode 50 portion. An influence of light absorption by the p-$Ga_{1-p}Al_pAs$ layer can be reduced with respect to light emission of a shorter wavelength by setting a higher content p. Actually, light emission having a luminous intensity of 1 cd was obtained in a green light emitting device having a peak wavelength at 555 nm in which p was set to be 0.7 to 0.8 and the content y of the active layer $In_{0.5}(Ga_{1-y}Al_y)_{0.5}P$ was set to be 0.5.

In the embodiment shown in FIG. 6, the p-type side electrode and the current blocking layer are circular. The same effect as that of the above embodiment, however, can be obtained as long as the outer surface of the p-type side electrode coincides with or is included in that of the current blocking layer. In addition, although n-InGaAlP is used as the current blocking layer in the above embodiment, any material, e.g., n-GaAs can be used as long as it prevents an easy flow of an injection current and has a selective etching property with respect to the underlying cap layer. In this case, GaAs serves as an absorption layer with respect to light emission of the active layer. Since however, a light extraction efficiency obtained in the other region is increased to be much higher than that obtained in conventional structures, the use of this structure is very advantageous. Furthermore, although p-GaAlAs is used as the buried layer formed upon second crystal growth in the embodiment shown in FIG. 6, any material, e.g., p-InGaAlP may be used as long as it has a band gap capable of obtaining transparency with respect to light emission of the active layer. In this case, however, in order to obtain transparency with respect to light emission of the active layer, the Al content of the buried layer must be larger than that o the active layer.

The structure using the current blocking layer according to the embodiment shown in FIG. 6 is not limited to that shown in FIG. 6. For example, as shown in FIG. 7, a satisfactory effect of obtaining light emission in a region except for a portion immediately below an electrode can be obtained by forming a layer directly on an upper clad layer consisting of p-InGaAlP and forming a current blocking layer by a buried layer. Note that in FIG. 7, reference numerals 61 to 64 and 66 to 71 correspond to reference numerals 41 to 44 and 4 to 51 in FIG. 6, respectively.

Figure 8:
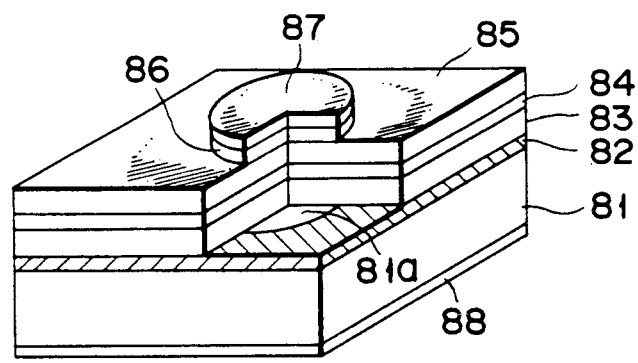
FIG. 8 is a perspective view showing an LED having an intermediate band gap region according still another embodiment of the present invention.

FIG. 8 is a partially cutaway perspective view showing an LED according to still another embodiment of the present invention.

Referring to FIG. 8, reference numeral 81 denotes a substrate consisting of p-GaAs; 82, an intermediate energy gap layer consisting of p-InGaP; 83, a lower clad layer consisting of p-$In_{0.5}(Ga_{1-x}Al_x)_{0.5}P$, 84, an active layer consisting of $In_{0.5}(Ga_{1-z}Al_z)_{0.5}P$; 85, an upper clad layer consisting of n-$In_{0.5}(Ga_{1-y}Al_y)P$; 86, a contact layer consisting of n-GaAs; 87, an n type side electrode; and 88, a p-type side electrode. The intermediate energy gap layer 82 is formed in a complementary pattern of that of the electrode 87. That is, the intermediate energy gap layer 82 is not present immediately below the n-type side electrode 87, and the lower clad layer 83 consisting of p-InGaAlP is in direct contact with an exposed portion 81a of the p-GaAs substrate 81 immediately below the electrode 87.

Figure 9:
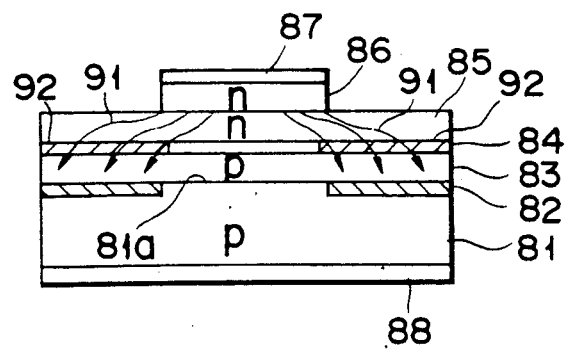
FIG. 9 is a sectional view showing the LED shown in FIG. 8.

FIG. 9 is a sectional view showing a structure of the device shown in FIG. 8, in which a current distribution and a light emitting portion in the device are illustrated. Referring to FIG. 9, an arrow 91 indicates a current distribution in the device, and a hatched portion 92 indicates a light emitting portion. In order to obtain a high light emission efficiency, Al contents x, y, and z of each layer satisfy $z \leq x$ and $z \leq y$, i.e., a double heterojunction is formed such that an energy gap of an active layer 94 serving as light emitting layer is smaller than those of the two, p- and n-type clad layers 83 and 85. Note that although an LED having such a double heterojunction structure will be described below, a layer structure of an active layer portion is not essential in terms of a light extraction efficiency, and a single heterojunction structure or a homojunction structure can be similarly used.

In the structure as shown in FIGS. 8 and 9, a voltage drop in an interface between the substrate 81 consisting of p-GaAs and the lower clad layer 83 consisting of p-InGaAlP is much larger than those in interfaces between the substrate 81, the intermediate energy gap layer 82 consisting of p-InGaP, and the clad layer 83 consisting of p-InGaAlP. Therefore, a current selectively flows through a portion in which the intermediate energy gap layer 82 consisting of p-InGaP is present. In this case, since the resistivity of the lower clad layer 83 consisting of p-InGaAlP is higher than that of the upper clad layer 85 consisting of n-InGaAlP, the current is widely spread in the upper clad layer 85. Therefore, in the active layer 84 consisting of InGaAlP, the current flows through a peripheral portion immediately below the electrode 87.

According to this embodiment as described above, since the intermediate energy gap layer 82 is not present immediately below the electrode 87, most of light emission takes place in a portion in which the electrode 87 is not present. Therefore, emitted light is externally extracted without being interrupted by neither the contact layer 86 nor the electrode 87, thereby realizing a high extraction efficiency and therefore high-luminance light emission.

FIG. 10 is a perspective view showing a schematic arrangement of still another embodiment of the present invention, and FIG. 11 is a schematic view showing a positional relationship between an intermediate energy gap layer and an n-type side electrode in this embodiment viewed from the device surface side. In FIGS. 10 and 11, reference numerals 101 to 108 correspond to reference numerals 81 to 88 in FIG. 8, and materials and composition ratios of the respective portions are the same as those of the embodiment shown in FIG. 8. This embodiment differs from the above embodiment in patterns of the n-type side electrode and the intermediate energy gap layer. That is, a plurality of n-type side electrodes 107 are arranged to form stripes, and a plurality of intermediate energy gap layers 102 are arranged to form stripes in a direction perpendicular to the direction of the electrodes 107.

In such an arrangement of the intermediate energy gap layers 102 and the n-type side electrodes 107, portions in which the layers 102 are placed immediately below the electrodes 107 are present. Since, however, current spread to portions not covered with the electrodes 107 is large, a high light extraction efficiency can be realized. The structure shown in FIG. 10 has an advantage in that no complicated mask alignment need be performed upon formation of the intermediate energy gap layers 102 and the n-type side electrodes 107.

In this embodiment, a light extraction efficiency can be further increased by arranging the intermediate energy gap layers 102 parallel to the n-type side electrodes 107, i.e., arranging the layers 102 in a complementary pattern to that of the electrodes 107. In this case, however, mask alignment must be performed for the layers 102 and the electrodes 107.

The present invention is not limited to the above embodiments. In each of the embodiments shown in FIGS. 8 to 10, a semiconductor light emitting device using p-InGaP as the intermediate energy gap layer has been described. The same effect can be obtained by using a material having an intermediate energy gap between the InGaAlP clad layer and the GaAs substrate, e.g., InGaAlP or GaAlAs as the intermediate energy gap layer. In the present invention, the structure of the light emitting portion is not limited to a double heterojunction but may be a single heterojunction or a homojunction. In addition, the conductivity type of each portion can be reversed. In this case, a positional relationship of the p- and n-type clad layers is vertically reversed. Although current spread in the active layer becomes smaller than that in the above embodiments, it is still much larger than that obtained in conventional structures.

As has been described above in detail, according to the embodiments shown in FIGS. 8 to 10, the intermediate energy gap layer is selectively formed between the substrate and the light emitting portion, at least a portion immediately below the electrode at the light extraction side has no intermediate energy gap layer, and the intermediate energy gap layer is present in a region immediately below the electrode. Therefore, a current flowing from the electrode to the intermediate energy gap layer is spread to a region except for the region immediately below the electrode. As a result, a light emitting region can be spread to the region except for the region immediately below the electrode to increase a light extraction efficiency, thereby realizing a semiconductor light emitting device having a high luminance.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

What is claimed is:

1. In a semiconductor light emitting device comprising:
   a compound semiconductor substrate of a first conductivity type;
   an InGaAlP layer formed on said substrate and having a light emitting region;
   a GaAlAs layer of a second conductivity type formed on said InGaAlP layer and having a larger band gap than that of said InGaAlP layer; and
   an electrode formed on a part of said GaAlAs layer, wherein light is emitted from a surface at the electrode side except for said electrode.

2. A device according to claim 1, wherein said GaAlAs layer has a composition of $Ga_{1-p}Al_pAs$ ($0.45 \leq p \leq 1$).

3. A device according to claim 1, wherein said InGaAlP layer is an active layer having a composition of $In_{0.5}(Ga_{1-y}Al_y)_{0.5}P$ ($0 \leq y \leq 1$).

4. A device according to claim 3, wherein a lower clad layer of the first conductivity type having a composition of $In_{0.5}(Ga_{1-x}Al_x)_{0.5}P$ ($0 \leq x \times \leq 1$) is formed between said substrate and said active layer, and an upper clad layer of the second conductivity type having a composition of $In_{0.5}(Ga_{1-x}Al_z)_{0.5}P$ ($0 \leq z \leq 1$) is formed between said active layer and said InGaAlP layer, x, y, and z satisfying $y \leq x$ and $y \leq z$.

5. A device according to claim 4, wherein said GaAlAs layer has a larger layer thickness than that of said upper clad layer.

6. A device according to claim 1, wherein said electrode consists essentially of AuZn.

7. A device according to claim 1, wherein a contact layer consisting essentially of GaAs of the second conductivity type is formed between said GaAlAs layer and said electrode.

8. In a semiconductor light emitting device comprising:
   a compound semiconductor substrate of a first conductivity type;
   a lower clad type layer formed on said substrate and consisting essentially of InGaAlP of the first conductivity type:
   an active layer formed on said lower clad layer and consisting essentially of InGaAlP;
   an upper clad layer formed on said active layer and consisting essentially of InGaAlP of a second conductivity type:
   a GaAlAs layer of a second conductivity type formed on said upper clad layer and having a larger band gap than that of said InGaAlP layer constituting said active layer and;
   an electrode formed on a part of said GaAlAs layer wherein light is emitted from a surface at said electrode side except for said electrode.

9. A device according to claim 8, wherein said GaAlAs layer has a larger layer thickness than that of said upper clad layer.

10. A device according to claim 8, wherein said GaAlAs layer has a composition of $Ga_{1-p}Al_pAs$ ($0.45 \leq 1$).

11. A device according to claim 8, wherein said active layer has a composition of $In_{0.5}(Ga_{1-y}Al_y)_{0.5}P$ ($0 \leq y1$).

12. A device according to claim 8, wherein said electrode consists essentially of AuZn.

13. A device according to claim 8, wherein a contact layer consisting essentially of GaAs of the second conductivity type is formed between said GaAlAs layer and said electrode.

14. A device according to claim 8, wherein said device is a light emitting diode.

* * * * *